US012712018B2

(12) United States Patent
Lin et al.

(10) Patent No.: US 12,712,018 B2

(45) Date of Patent: Aug. 18, 2026

(54) SEGMENTED REFERENCE FOR TRACKING COLUMN LOADING

(71) Applicant: Taiwan Semiconductor Manufacturing Company, Ltd., Hsinchu (TW)

(72) Inventors: Ku-Feng Lin, New Taipei City (TW); Perng-Fei Yuh, Hsinchu (TW); Tung-Cheng Chang, Xihu Township (TW); Yu-Fan Lin, Guishan Township (TW); Sheng-Po Huang, New Taipei City (TW); Yih Wang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 285 days.

(21) Appl. No.: 18/400,921

(22) Filed: Dec. 29, 2023

(65) Prior Publication Data

US 2025/0218509 A1 Jul. 3, 2025

(51) Int. Cl.

*G11C 16/04* (2006.01)
*G11C 13/00* (2006.01)

(52) U.S. Cl.

CPC ........ *G11C 13/004* (2013.01); *G11C 13/0028* (2013.01); *G11C 2013/0054* (2013.01)

(58) Field of Classification Search

CPC .............. G11C 13/004; G11C 13/0028; G11C 2013/0054

See application file for complete search history.

(56) References Cited

U.S. PATENT DOCUMENTS 9,502,091 B1 * 11/2016 Jung .................. G11C 11/4091
10,199,112 B1 2/2019 Tran et al.
2010/0277972 A1 * 11/2010 Ueda .................. G11C 11/1659 365/158
2012/0051130 A1 * 3/2012 Hung ................ G11C 16/3418 365/185.23
2012/0206986 A1 * 8/2012 Wang .................... G11C 11/419 365/210.1
2022/0358973 A1 11/2022 Lin et al.
2023/0352071 A1 11/2023 Lee et al.

FOREIGN PATENT DOCUMENTS

CN 110998736 B 11/2023

* cited by examiner

*Primary Examiner* — Pho M Luu

(74) *Attorney, Agent, or Firm* — Merchant & Gould P.C.

(57) ABSTRACT

A semiconductor device including at least one sense amplifier, a first memory array that includes first segments of first memory cells situated on a first side of the at least one sense amplifier, a second memory array that includes second segments of second memory cells situated on a second side of the at least one sense amplifier, first reference cells connected to first reference word lines in the first memory array for sensing data from the second memory cells and second reference cells connected to second reference word lines in the second memory array for sensing data from the first memory cells. The first reference cells connected to one of the first reference word lines for sensing data from one of the second segments and the first reference cells connected to another one of the first reference word lines for sensing data from another one of the second segments.

20 Claims, 11 Drawing Sheets

| Scheme | Error rate | Area overhead |
|---|---|---|
| Global reference | High | ~1% (1Ref/512WL+trim code) |
| Local reference | Low | ~10% (4Ref/32BL+trim code) |
| Segmented reference | Medium-low | 1%-5% (1Ref/16-64WL+trim code) |

SEGMENTED REFERENCE FOR TRACKING COLUMN LOADING

BACKGROUND

Some memory devices, such as magnetic random-access memory (MRAM), phase-change random-access memory (PCRAM), and resistive random-access memory (RRAM), store data by programming resistances of memory cells. Typically, in a read operation, data is read from one of these memory cells and compared to a reference value, such as a reference voltage or a reference current. The comparison result is provided as output data. Often, the read margin between the data and the reference value is small and the data may be sensitive to column loading effects, such as bit line and source line resistance variations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
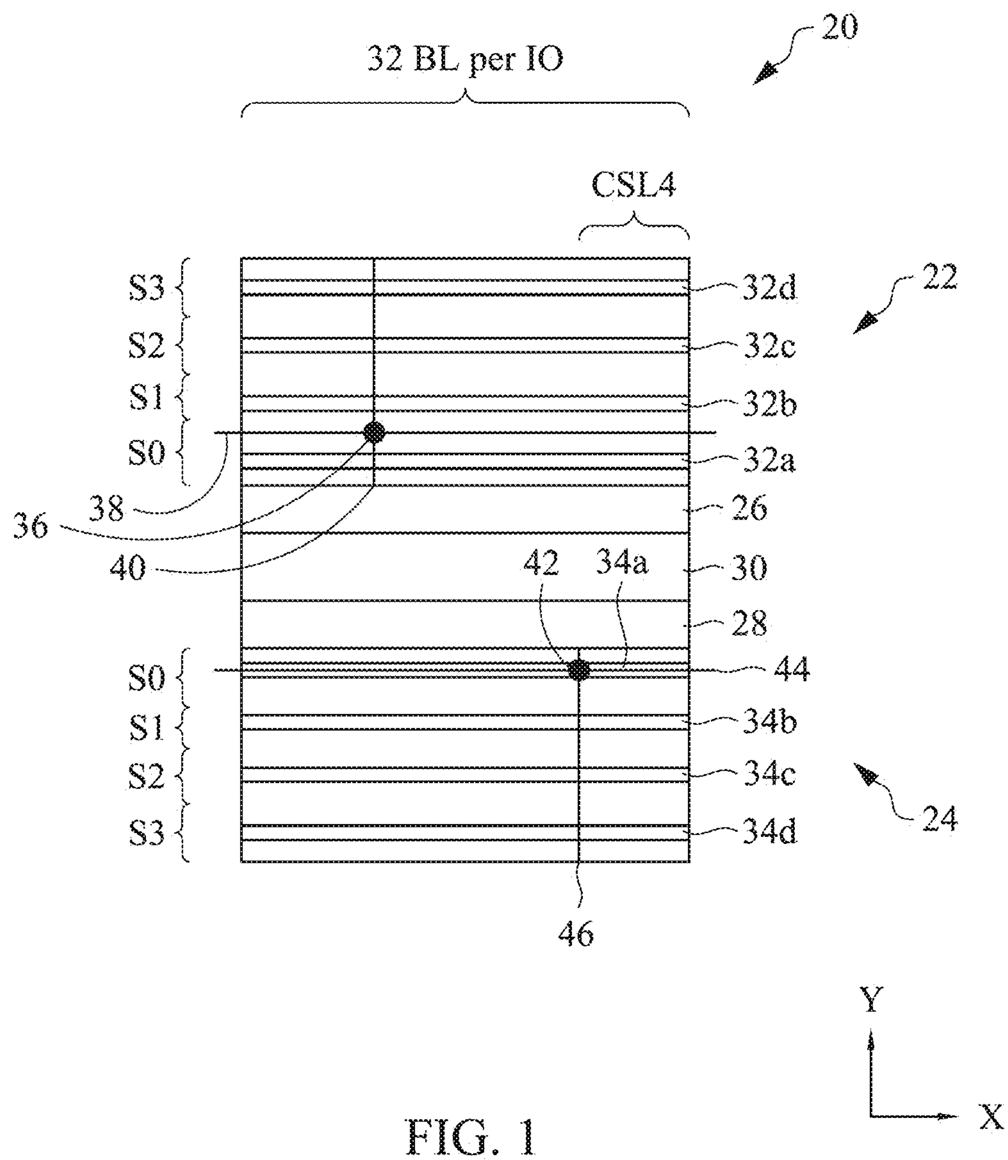
FIG. 1 is a diagram schematically illustrating a semiconductor memory device that includes a segmented reference structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Different reference schemes or structures can be used to provide the reference values that are compared to the data received from the memory cells to provide output data. In a memory device that includes global references, one reference cell set is shared by 128 or more different word lines, where each word line is connected to many different memory cells in bit lines. The one reference cell set is configured to provide reference values for all the memory cells connected to the 128 or more different word lines. However, one reference cell set cannot closely track or follow so many different memory cells due, at least in part, to column loading effects, such as bit line and source line resistance variations. This is especially true for memory cells situated along edges of a memory cell array, where bit line and source line resistance variations have a higher sigma, i.e., standard deviation. The read margins are smaller due to the higher-sigma of the bit line and source line resistance variations along the edges of the memory cell array and for large arrays, such as greater than or equal to 128 kilobits (kb). In memory devices with global references, a major concern is yield loss and/or higher read error rates.

In memory devices that include local references, one reference cell set is used per word line. The area of the reference cells in a memory device that has local references occupies about 8% of the memory device, such as in a memory device that has common source lines (CSL) of 4 columns and a multiplexer for 32 columns. Also, a large amount of reference trim code is included due to the large number of local reference cells. The reference trim code storage occupies about 3% of the memory device area. Thus, in the memory devices with local references, a major concern is area overhead.

Disclosed embodiments provide a reference scheme or structure that balances the trade-off between yield loss/error rates and device area. Disclosed embodiments provide a semiconductor device that includes a segmented reference scheme or structure. In a segmented reference structure, one reference cell set is shared by a segment of word lines, such as a segment of word lines that includes 16 to 64 memory cell word lines that are each connected to many bit lines. The reference cell set provides reference values for the memory cells connected to the segment of word lines. In comparison to a global reference structure, the segmented reference structure more closely tracks or follows the memory cells connected to the word lines in the segment of word lines. In some embodiments, the size of a segment of word lines, i.e., the number of word lines in a segment, is determined based, at least in part, on column loading effects, such as bit line and source line resistance variations. In some embodiments, the memory cells situated along edges of a memory cell array have higher bit line and source line resistance variations, i.e., a higher sigma. In some embodiments, the size of a segment of word lines is reduced to 4 to 8 word lines near the edge of a memory cell array to better follow the higher sigma of the bit line and source line resistance variations, where denser reference word lines better track or follow column loading effects. The segmented reference structure improves read margins of the memory device. In addition, a memory device with a segmented reference structure includes less reference trim code than a memory device with local references, such that the device area is reduced.

In some embodiments, a semiconductor device includes a first memory array that includes first segments of first memory cells situated on a first side of at least one sense amplifier and a second memory array that includes second segments of second memory cells situated on a second side of the at least one sense amplifier. First reference cells connected to first reference word lines in the first memory array are configured to provide first reference signals for sensing data from the second memory cells in the second memory array, and second reference cells connected to second reference word lines in the second memory array are configured to provide second reference signals for sensing data from the first memory cells in the first memory array.

In some embodiments, the first reference cells connected to one of the first reference word lines are configured to provide the first reference signals for sensing data from one of the second segments and the first reference cells connected to another one of the first reference word lines are configured to provide the first reference signals for sensing data from another one of the second segments. Also, the second reference cells connected to one of the second reference word lines are configured to provide the second reference signals for sensing data from one of the first segments and the second reference cells connected to another one of the second reference word lines are configured to provide the second reference signals for sensing data from another one of the first segments.

Disclosed embodiments further provide a method of operating a semiconductor device that has a segmented reference structure. The method includes selecting a first memory cell from one segment of first segments in a first memory array and selecting a first reference cell from one segment of second segments in a second memory array. The method further includes comparing data from the first memory cell to reference signals from the first reference cell to determine a first stored data value.

FIG. 1 is a diagram schematically illustrating a semiconductor memory device 20 that includes a segmented reference structure, in accordance with some embodiments. The memory device 20 includes a first or upper memory array 22, a second or lower memory array 24, a first multiplexer 26, a second multiplexer 28, and sense amplifiers 30. The first multiplexer 26 is connected to the first memory array 22 and the sense amplifiers 30, and the second multiplexer 28 is connected to the second memory array 24 and the sense amplifiers 30.

The first memory array 22 includes first memory cells that store data and first reference cells that provide reference signals. The first memory cells are connected to first memory cell word lines situated in rows along, i.e., in parallel with, the x-axis of the first memory array 22 and to first bit lines in columns along, i.e., in parallel with, the y-axis of the first memory array 22. Each of the first memory cell word lines is connected to multiple first memory cells for storing data in the first memory array 22 and providing data signals to the sense amplifiers 30 through the first multiplexer 26. The first reference cells are connected to first reference cell word lines in first reference cell word line rows **32*a*-32*d* along the x-axis of the first memory array 22 and to first bit lines that are in columns along the y-axis of the first memory array 22. Each of the first reference cell word lines in the first reference cell word line rows 32*a*-32*d* is connected to multiple reference cells for providing reference signals to the sense amplifiers 30 through the first multiplexer 26. In some embodiments, the first memory array 22 includes 4 CSL. In some embodiments, the first memory array 22** includes 32 bit lines per input/output (IO).

The second memory array 24 includes second memory cells that store data and second reference cells that provide reference signals. The second memory cells are connected to second memory cell word lines that are in rows along the x-axis of the second memory array 24 and to second bit lines that are in columns of the second memory array 24. Each of the second memory cell word lines is connected to multiple second memory cells for storing data in the second memory array 24 and providing data signals to the sense amplifiers 30 through the second multiplexer 28. Also, the second reference cells are connected to second reference cell word lines in second reference cell word line rows **34*a*-34*d* along the x-axis of the second memory array 24 and to second bit lines that are in columns along the y-axis of the second memory array 24. Each of the second reference cell word lines in the reference cell word line rows 34*a*-34*d* is connected to multiple reference cells for providing reference signals to the sense amplifiers 30 through the second multiplexer 28. In some embodiments, the second memory array 24 includes 4 CSL. In some embodiments, the second memory array 24** includes 32 bit lines per IO.

Each of the first memory array 22 and the second memory array 24 includes segments of word lines S0-S3, where each of the segments of word lines S0-S3 includes multiple memory cell word lines and at least one reference cell word line. In some embodiments, each of the segments of word lines S0-S3 includes from 16 to 64 memory cell word lines and at least one reference cell word line. In some embodiments, each of the segments of word lines S0-S3 includes 16 memory cell word lines and at least one reference word line. In some embodiments, each of the segments of word lines S0-S3 includes 64 memory cell word lines and at least one reference word line. In some embodiments, each of the segments of word lines S0-S3 includes two reference cell word lines.

In some embodiments, the size of a segment of word lines S0-S3 is determined, at least in part, by column loading effects, such as bit line and source line resistance variations. In some embodiments, the size of a segment of word lines S0-S3 is reduced to 4 to 8 memory cell word lines near the edge of a memory cell array to better follow the higher sigma of the bit line and source line resistance variations, where denser reference word lines better track or follow column loading effects.

In operation, one of the memory cells in one of the segments of word lines S0-S3 in one of the memory arrays 22 and 24 is selected by selecting a memory cell word line and a bit line. Data from the selected memory cell is provided to the first multiplexer 26 or the second multiplexer 28 and forwarded to a first input of one of the sense amplifiers 30. Also, one of the reference cells in the one of the segments of word lines S0-S3 in the other one of the memory arrays 22 and 24 is selected by selecting the reference cell word line and a bit line. A reference signal from the reference cell is provided to the other one of the first multiplexer 26 or the second multiplexer 28 and forwarded to a second input of the one of the sense amplifiers 30. The sense amplifier compares the data at the first input to the reference signal at the second input and provides an output data signal.

For example, one of the memory cells 36 in the segment of word lines S0 in the first memory array 22 is selected by selecting memory cell word line 38 and memory cell bit line 40. Data from the selected memory cell 36 is provided to the first multiplexer 26 and forwarded to a first input of one of the sense amplifiers 30. Also, one of the reference cells 42 in the segment of word lines S0 in the second memory array 24 is selected by selecting the reference cell word line 44 and a reference cell bit line 46. A reference signal from the selected reference cell 42 is provided to the second multiplexer 28 and forwarded to a second input of the one of the sense amplifiers 30, which compares the data at the first input to the reference signal at the second input and provides an output data signal.

If a memory cell is selected from one of the segments of word lines S0-S3 in the first memory array 22, then a reference cell is selected from the same, corresponding segment of word lines S0-S3 in the second memory array 24, and if a memory cell is selected from one of the segments of word lines S0-S3 in the second memory array 24, then a reference cell is selected from the same, corresponding segment of word lines S0-S3 in the first memory array 22.

The segmented reference structure improves read margins beyond the read margins of a memory device that has a global reference structure. In addition, a memory device with a segmented reference structure includes less reference trim code than a memory device with local references, such that device area is reduced.

Figure 2:
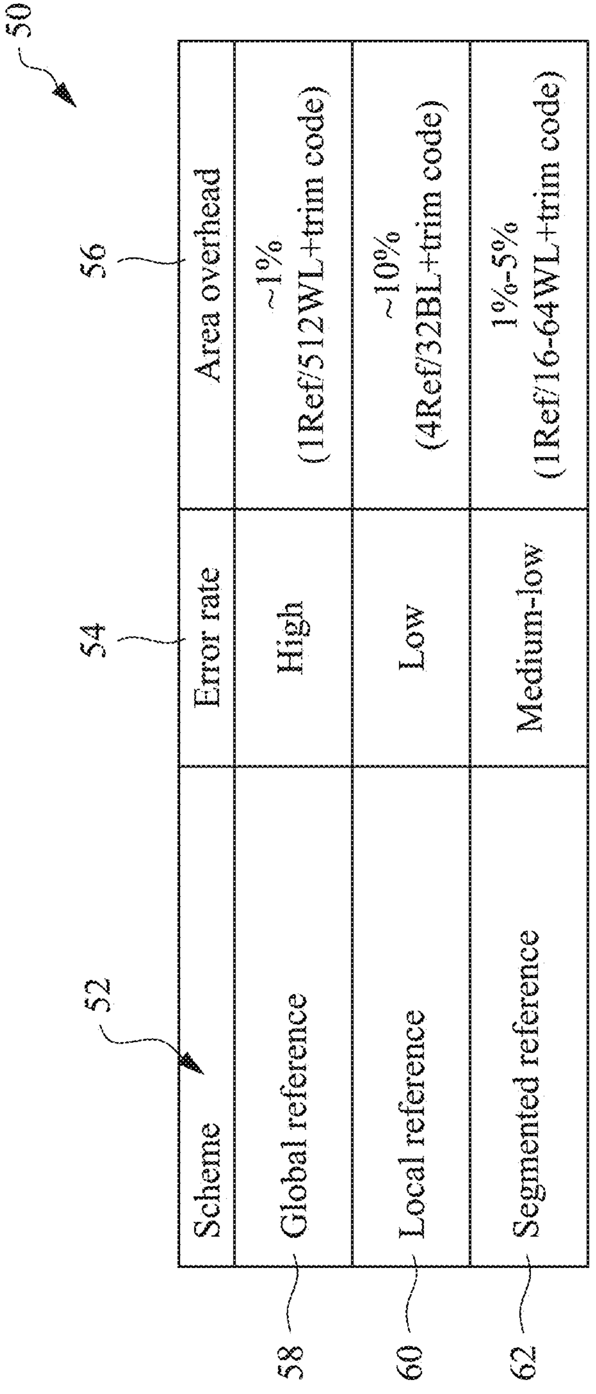
FIG. 2 is a diagram schematically illustrating a table of different reference structures or schemes versus error rate and area overhead of the scheme, in accordance with some embodiments.

FIG. 2 is a diagram schematically illustrating a table 50 of different reference structures 52 versus error rate 54 and area overhead 56, in accordance with some embodiments. A global reference structure 58 with 1 reference cell set per greater than or equal to 128 memory cell word lines, such as 512 memory cell word lines, has a high error rate. However, with trim code for only 1 reference cell set, it has a low area overhead of about 1% of the memory device.

A local reference structure 60 with 1 reference cell set per word line, 4 reference cell bit lines per 32 memory cell bit lines, and with trim code for each of the word lines has a low error rate, but a high area overhead of about 10% of the memory device.

A segmented reference structure 62 with 1 reference cell set per segment of 16 to 64 word lines and with trim code has a low to medium error rate and a low to medium overhead of about 1% to 5% of the memory device. In some embodiments, the amount of trim code in a segmented reference structure is sixteen times less than the amount of trim code in a local reference structure.

Figure 3:
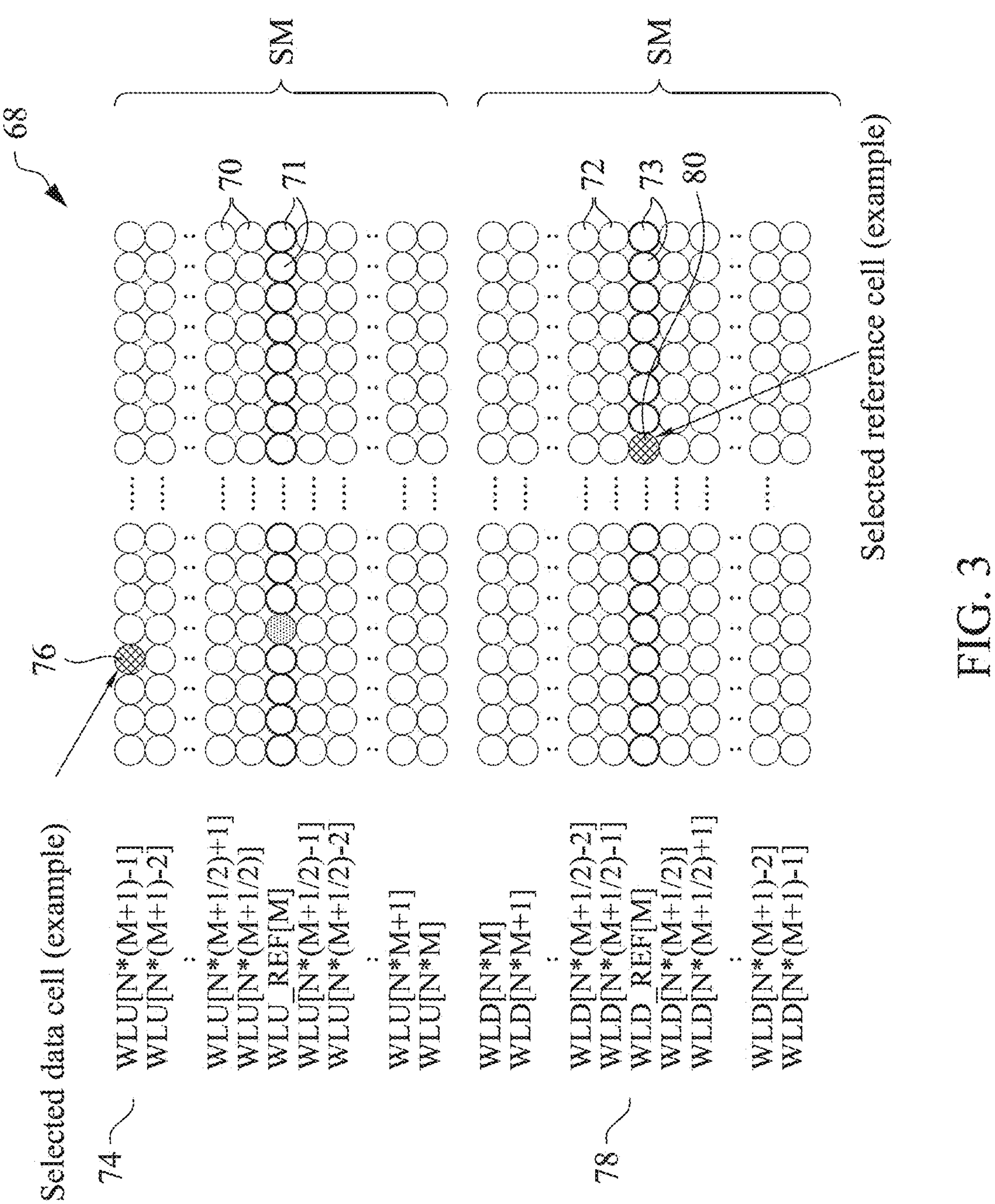
FIG. 3 is a diagram schematically illustrating a memory device that includes first memory cell word lines and one reference cell word line in a segment of word lines in the first memory array and second memory cell word lines and one reference cell word line in the same, corresponding segment of word lines in the second memory array, in accordance with some embodiments.

FIG. 3 is a diagram schematically illustrating a memory device 68 that includes first memory cells 70 in a segment of word lines SM, such as in segment S0, in the first memory array 22 and second memory cells 72 in the same, corresponding segment of word lines SM, such as in segment S0, in the second memory array 24, in accordance with some embodiments. Also, the segment of word lines SM in the first memory array 22 includes reference cell word line WLU_REF(M) that includes first reference cells 71, and the segment of word lines SM in the second memory array 24 includes reference cell word line WLD_REF(M) that includes second reference cells 73.

The first or upper memory array 22 includes segments of word lines SM that each include N memory cell word lines and 1 reference cell word line. In this example, the first memory array 22 includes segments of word lines SM from M equals 0 to M equals 31 and N equals 16 memory cell word lines per segment of word lines SM. This provides 512 memory cell word lines in the first memory array 22. Also, the second or lower memory array 24 includes segments of word lines SM that each include N memory cell word lines and 1 reference cell word line. In this example, the second memory array 24 includes segments of word lines SM from M equals 0 to M equals 31 and N equals 16 memory cell word lines per segment of word lines SM, which provides 512 memory cell word lines in the second memory array 24. The total number of word lines in the memory device 68 is 1024 word lines with 512 word lines up (WLU) and 512 word lines down (WLD).

In the segment of word lines SM where M equals 0, i.e., in segment S0, of the first memory array 22, the reference cell word line WLU_REF(0) is situated in the middle of the memory cell word lines WLU(0) to WLU(15) with 8 memory cell word lines WLU(0) to WLU(7) below the reference cell word line WLU_REF(0) and 8 memory cell word lines WLU(8) to WLU(15) above the reference cell word line WLU_REF(0). Also, in segment S0 of the second memory array 24, the reference cell word line WLD_REF(0) is situated in the middle of the memory cell word lines WLD(0) to WLD(15) with 8 memory cell word lines WLD (0) to WLD(7) above the reference cell word line WLD_REF(0) and 8 memory cell word lines WLD(8) to WLD(15) below the reference cell word line WLD_REF(0).

In operation, a memory cell is selected from one segment of word lines SM of one of the first memory array 22 and the second memory array 24 and a reference cell is selected from the same, corresponding segment of word lines SM of the other one of the first memory array 22 and the second memory array 24. Data from the selected memory cell is compared to a reference signal from the selected reference cell to provide output data for the selected memory cell.

For example, memory cell word line WLU(15) 74 is activated to select data cell 76 from segment S0 of the first memory array 22, and reference word line WLD_REF(0) 78 is activated to select reference cell 80 from segment S0 of the second memory array 24. The data from data cell 76 is compared to the reference signal from reference cell 80 to provide the output data.

Figure 4:
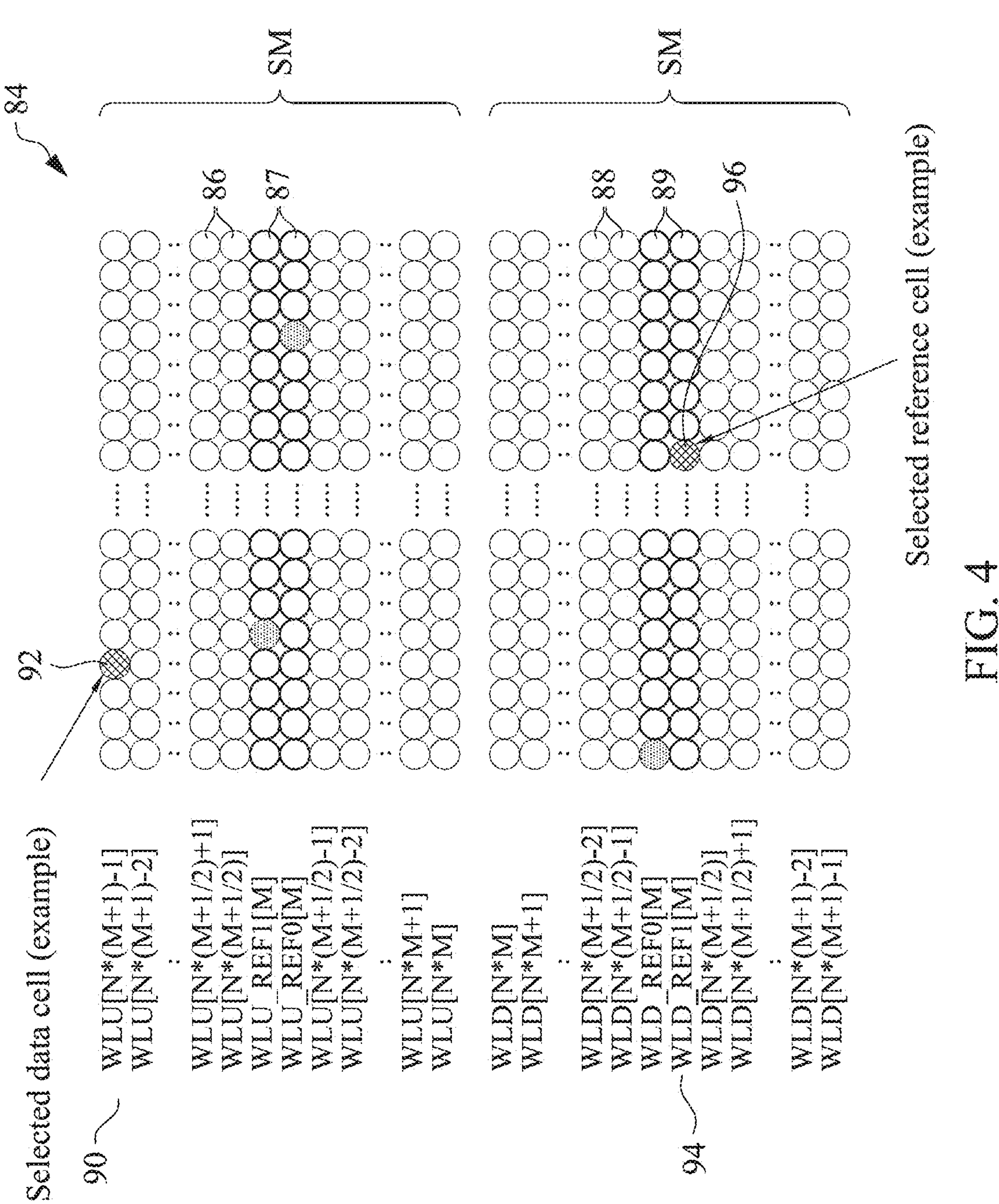
FIG. 4 is a diagram schematically illustrating a memory device that includes first memory cell word lines and two reference cell word lines in a segment of word lines in the first memory array and second memory cell word lines and two reference cell word lines in the same, corresponding segment of word lines in the second memory array, in accordance with some embodiments.

FIG. 4 is a diagram schematically illustrating a memory device 84 that includes first memory cells 86 in a segment of word lines SM, such as segment S0, in the first memory array 22 and second memory cells 88 in the same, corresponding segment of word lines SM, such as segment S0, in the second memory array 24, in accordance with some embodiments. Also, the segment of word lines SM in the first memory array 22 includes reference cell word lines WLU_REF0(M) and WLU_REF1(M) that include first reference cells 87, and the segment of word lines SM in the second memory array 24 includes reference cell word lines WLD_REF0(M) and WLD_REF1(M) that includes second reference cells 89.

The first or upper memory array 22 includes segments of word lines SM that each include N memory cell word lines and 2 reference cell word lines. In this example, the first memory array 22 includes segments of word lines SM from M equals 0 to M equals 15 and N equals 32 memory cell word lines per segment of word lines SM. This provides 512 memory cell word lines in the first memory array 22. The second or lower memory array 24 includes segments of word lines SM that each include N memory cell word lines and 2 reference cell word lines. In this example, the second memory array 24 includes segments of word lines SM from M equals 0 to M equals 15 and N equals 32 memory cell word lines per segment of word lines SM, which provides 512 memory cell word lines in the second memory array 24. The total number of word lines in the memory device 84 is 1024 word lines with 512 WLU and 512 WLD. In other embodiments, each of the segments of word lines SM include more than 2 reference cell word lines.

In the segment of word lines SM where M equals 0, i.e., in segment S0, of the first memory array 22, the reference cell word lines WLU_REF0(0) and WLU_REF1(0) are situated in the middle of the memory cell word lines WLU(0) to WLU(31) with 16 memory cell word lines WLU(0) to WLU(15) below the reference cell word lines WLU_REF0(0) and WLU_REF1(0) and 16 memory cell word lines WLU(16) to WLU(31) above the reference cell word lines WLU_REF0(0) and WLU_REF1(0).

Also, in segment S0 of the second memory array 24, the reference cell word lines WLD_REF0(0) and WLD_REF1(0) are situated in the middle of the memory cell word lines WLD(0) to WLD(31) with 16 memory cell word lines WLD(0) to WLD(15) above the reference cell word lines WLD_REF0(0) and WLD_REF1(0) and 16 memory cell word lines WLD(16) to WLD(31) below the reference cell word lines WLD_REF0(0) and WLD_REF1(0).

The reference cell word line WLU_REF0(M) in the first memory array 22 is used to provide reference signals for tracking even memory cell word lines WLD(Even) in the second memory array 24, and the reference cell word line WLU_REF1(M) in the first memory array 22 is used to provide reference signals for tracking odd memory cell word lines WLD(Odd) in the second memory array 24. Also, the reference cell word line WLD_REF0(M) in the second memory array 24 is used to provide reference signals for tracking even memory cell word lines WLU(Even) in the first memory array 22, and the reference cell word line WLD_REF1(M) in the second memory array 24 is used to provide reference signals for tracking odd memory cell word lines WLU(Odd) in the first memory array 22.

In operation, a memory cell is selected from one segment SM of one of the first memory array 22 and the second memory array 24 and a reference cell is selected from the same, corresponding segment SM of the other one of the first memory array 22 and the second memory array 24. If the selected memory cell is in an even memory cell word line of the one of the first memory array 22 and the second memory array 24, then a reference cell is selected from the even reference cell word line in the other one of the first memory array 22 and the second memory array 24. If the selected memory cell is in an odd memory cell word line of the one of the first memory array 22 and the second memory array 24, then a reference cell is selected from the odd reference cell word line in the other one of the first memory array 22 and the second memory array 24. Data from the selected memory cell is compared to a reference signal from the selected reference cell to provide output data for the selected memory cell.

For example, memory cell word line WLU(31) 90, which is an odd memory cell word line, is activated to select data cell 92 from segment S0 of the first memory array 22, and reference word line WLD_REF1(0) 94, which is the odd reference cell word line, is activated to select reference cell 96 from segment S0 of the second memory array 24. The data from the data cell 92 is compared to the reference signal from the reference cell 96 to provide the output data. In some embodiments, the even and odd reference cell word lines improve tracking of the memory cells in the even and odd memory cell word lines, respectively.

Figure 5:
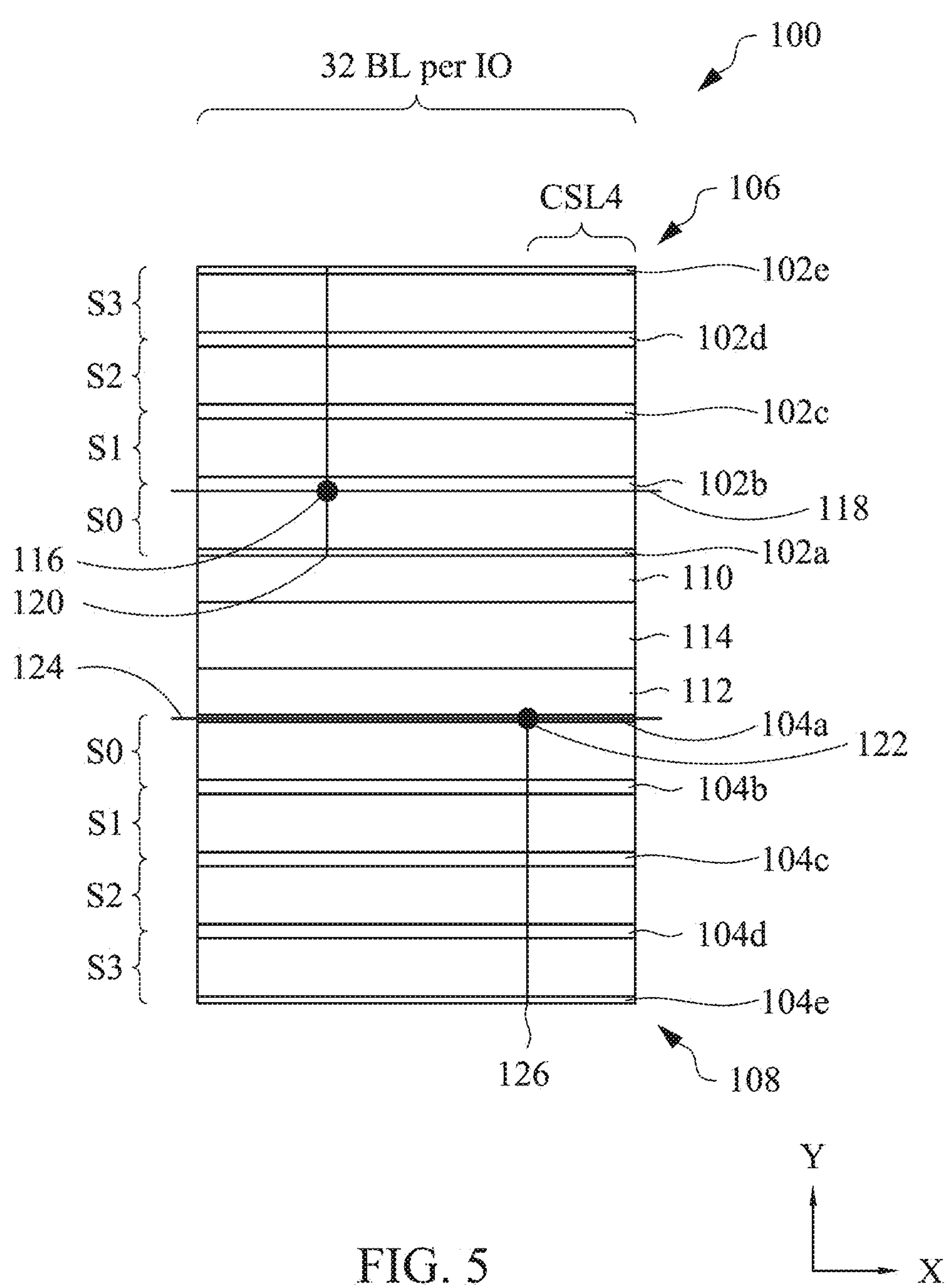
FIG. 5 is a diagram schematically illustrating a semiconductor memory device that includes a segmented reference structure that includes reference cell word lines situated at edges of each of the segments of word lines, in accordance with some embodiments.

FIG. 5 is a diagram schematically illustrating a semiconductor memory device 100 that includes a segmented reference structure that includes reference cell word lines in reference cell word line rows 102*a*-102*e* and 104*a*-104*e* situated at edges of the segments of word lines S0-S3, in accordance with some embodiments. The memory device 100 includes a first or upper memory array 106, a second or lower memory array 108, a first multiplexer 110, a second multiplexer 112, and sense amplifiers 114. The first multiplexer 110 is connected to the first memory array 106 and the sense amplifiers 114, and the second multiplexer 112 is connected to the second memory array 108 and the sense amplifiers 114.

The first memory array 106 includes first memory cells that store data and first reference cells that provide reference signals. The first memory cells are connected to first memory cell word lines in rows along the x-axis of the first memory array 106 and to first bit lines in columns along the y-axis of the first memory array 106. Each of the first memory cell word lines is connected to multiple first memory cells for storing data in the first memory array 106 and providing data signals to the sense amplifiers 114 through the first multiplexer 110. The first reference cells are connected to first reference cell word lines in the first reference cell word line rows 102*a*-102*e* along the x-axis of the first memory array 106 and to first bit lines that are in columns along the y-axis of the first memory array 106. Each of the first reference cell word lines is connected to multiple reference cells for providing reference signals to the sense amplifiers 114 through the first multiplexer 110. In some embodiments, the first memory array 106 includes 32 bit lines per IO.

The second memory array 108 includes second memory cells that store data and second reference cells that provide reference signals. The second memory cells are connected to second memory cell word lines that are in rows along the x-axis of the second memory array 108 and to second bit lines that are in columns along the y-axis of the second memory array 108. Each of the second memory cell word lines is connected to multiple second memory cells for storing data in the second memory array 108 and providing data signals to the sense amplifiers 114 through the second multiplexer 112. Also, the second reference cells are connected to second reference cell word lines in second reference cell word line rows 104*a*-104*e* along the x-axis of the second memory array 108 and to second bit lines that are in columns along the y-axis of the second memory array 108. Each of the second reference cell word lines is connected to multiple reference cells for providing reference signals to the sense amplifiers 114 through the second multiplexer 112. In some embodiments, the second memory array 108 includes 32 bit lines per IO.

Each of the first memory array 106 and the second memory array 108 includes segments of word lines S0-S3, where each of the segments of word lines S0-S3 includes memory cell word lines and at least two reference cell word lines. In some embodiments, one of the at least two reference cell word lines is for providing reference signals for even memory cell word lines and another one of the at least two reference cell word lines is for providing reference signals for odd memory cell word lines. In some embodiments, each of the segments of word lines S0-S3 includes from 16 to 64 memory cell word lines and at least two reference cell word lines. In some embodiments, each of the segments of word lines S0-S3 includes 32 memory cell word lines and two reference word lines.

In some embodiments, the size of a segment of word lines S0-S3 is determined, at least in part, by column loading effects, such as bit line and source line resistance variations. In some embodiments, the size of a segment of word lines S0-S3 is reduced to 4 to 8 memory cell word lines near the edge of a memory cell array to better follow the higher sigma of the bit line and source line resistance variations, where denser reference word lines better track or follow column loading effects.

In operation, one of the memory cells in one of the segments of word lines S0-S3 in one of the memory arrays 106 and 108 is selected by selecting a memory cell word line and a bit line. Data from the selected memory cell is provided to the first multiplexer 110 or the second multiplexer 112 and forwarded to a first input of one of the sense amplifiers 114. Also, one of the reference cells in the same, corresponding segment of the segments of word lines S0-S3 in the other one of the memory arrays 106 and 108 is selected by selecting a reference cell word line and a bit line. A reference signal from the selected reference cell is provided to the other one of the first multiplexer 110 or the second multiplexer 112 and forwarded to a second input of the one of the sense amplifiers 114. The sense amplifier compares the data at the first input to the reference signal at the second input and provides an output data signal.

For example, one of the memory cells 116 in an odd memory cell word line in the segment of word lines S0 in the first memory array 106 is selected by selecting memory cell word line 118 and bit line 120. Data from the selected memory cell 116 is provided to the first multiplexer 110 and forwarded to a first input of one of the sense amplifiers 114. Also, one of the reference cells 122 in the reference cell word line 124 for odd memory cell word lines in the segment of word lines S0 in the second memory array 108 is selected by selecting the reference cell word line 124 and a bit line 126. A reference signal from the selected reference cell 122 is provided to the second multiplexer 112 and forwarded to a second input of the one of the sense amplifiers 114, which compares the data at the first input to the reference signal at the second input and provides an output data signal.

If a memory cell is selected from one of the segments of word lines S0-S3 in the first memory array 106, then a reference cell is selected from the same, corresponding segment of word lines S0-S3 in the second memory array 108, and if a memory cell is selected from one of the segments of word lines S0-S3 in the second memory array 108, then a reference cell is selected from the same, corresponding segment of word lines S0-S3 in the first memory array 106. Also, if the memory cell is selected by activating an even memory cell word line, then a reference cell is selected by activating a reference cell word line for even memory cell word lines, and if the memory cell is selected by activating an odd memory cell word line, then a reference cell is selected by activating a reference cell word line for odd memory cell word lines.

The segmented reference structure with multiple reference cell word lines per segment of word lines improves read margins in the memory device. In addition, the memory device with this segmented reference structure includes less reference trim code than a memory device with local references, such that device area is reduced.

Figure 6:
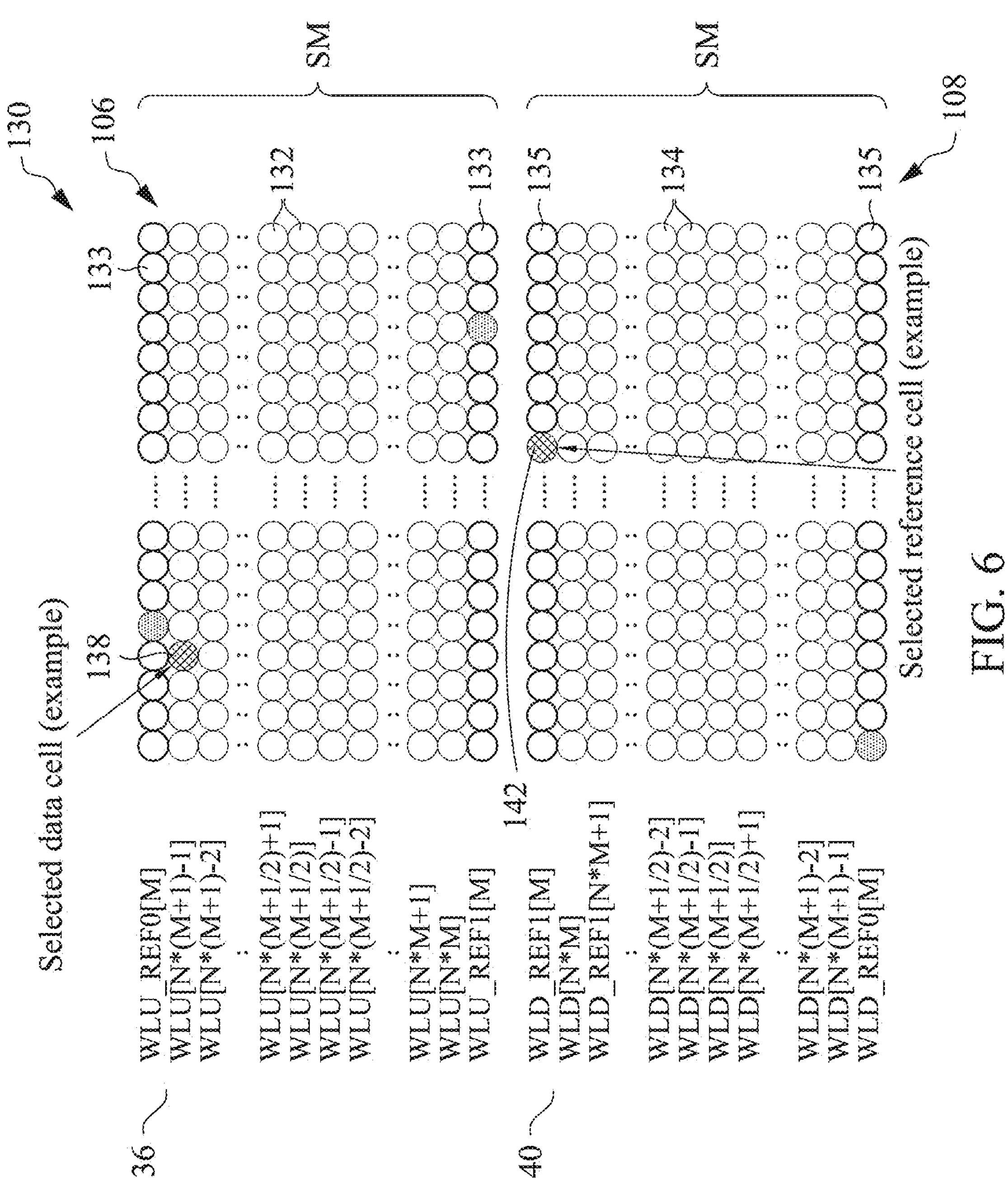
FIG. 6 is a diagram schematically illustrating a memory device that includes first memory cell word lines and two reference cell word lines at edges of a segment of word lines in the first memory array and second memory cell word lines and two reference cell word lines at edges in the same, corresponding segment of word lines in the second memory array, in accordance with some embodiments.

FIG. 6 is a diagram schematically illustrating a memory device 130 that includes first memory cells 132 in a segment of word lines SM, such as segment S0, in the first memory array 106 and second memory cells 134 in the same, corresponding segment of word lines SM, such as segment S0, in the second memory array 108, in accordance with some embodiments. Also, the segment of word lines SM in the first memory array 106 includes reference cell word lines WLU_REF0(M) and WLU_REF1(M) that include first reference cells 133, and the segment of word lines SM in the second memory array 108 includes reference cell word lines WLD_REF0(M) and WLD_REF1(M) that includes second reference cells 135.

The first or upper memory array 106 includes segments of word lines SM that each include N memory cell word lines and 2 reference cell word lines. In this example, the first memory array 106 includes segments of word lines SM from M equals 0 to M equals 15 and N equals 32 memory cell word lines per segment of word lines SM. This provides 512 memory cell word lines in the first memory array 106. The second or lower memory array 108 includes segments of word lines SM that each include N memory cell word lines and 2 reference cell word lines. In this example, the second memory array 108 includes segments of word lines SM from M equals 0 to M equals 15 and N equals 32 memory cell word lines per segment of word lines SM, which provides 512 memory cell word lines in the second memory array 108. The total number of word lines in the memory device 130 is 1024 word lines with 512 WLU and 512 WLD. In other embodiments, each of the segments of word lines SM can include more than 2 reference cell word lines.

In the segment of word lines SM where M equals 0, i.e., in segment S0, of the first memory array 106, the even reference cell word line WLU_REF0(0) is situated at the top edge of segment S0 above the memory cell word line WLU(31) and the odd reference cell word line WLU_REF1 (0) is situated at the bottom edge of segment S0 below the memory cell word line WLU(0), such that memory cell word lines WLU(0) to WLU(31) are situated between the even and odd reference cell word lines WLU_REF0(0) and WLU_REF1(0).

Also, in segment S0 of the second memory array 108, the even reference cell word line WLD_REF0(0) is situated at the bottom edge of segment S0 below the memory cell word line WLD(31) and the odd reference cell word line WLD_REF1(0) is situated at the top edge of segment S0 above the memory cell word line WLD(0), such that memory cell word lines WLD(0) to WLD(31) are situated between the even and odd reference cell word lines WLD_REF0(0) and WLD_REF1(0).

The reference cell word line WLU_REF0(M) in the first memory array 106 is used to provide reference signals for tracking even memory cell word lines WLD(Even) in the second memory array 108, and the reference cell word line WLU_REF1(M) in the first memory array 106 is used to provide reference signals for tracking odd memory cell word lines WLD(Odd) in the second memory array 108. Also, the reference cell word line WLD_REF0(M) in the second memory array 108 is used to provide reference signals for tracking even memory cell word lines WLU(Even) in the first memory array 106, and the reference cell word line WLD_REF1(M) in the second memory array 108 is used to provide reference signals for tracking odd memory cell word lines WLU(Odd) in the first memory array 106.

In operation, a memory cell is selected from one segment SM of one of the first memory array 106 and the second memory array 108 and a reference cell is selected from the same, corresponding segment SM of the other one of the first memory array 106 and the second memory array 108. If the selected memory cell is in an even memory cell word line in the one of the first memory array 106 and the second memory array 108, then a reference cell is selected from the even reference cell word line in the other one of the first memory array 106 and the second memory array 108. If the selected memory cell is in an odd memory cell word line in the one of the first memory array 106 and the second memory array 108, then a reference cell is selected from the odd reference cell word line in the other one of the first memory array 106 and the second memory array 108. Data from the selected memory cell is compared to a reference signal from the selected reference cell to provide output data for the selected memory cell.

For example, memory cell word line WLU(31) 136, which is an odd memory cell word line, is activated to select data cell 138 from segment S0 of the first memory array 106, and reference word line WLD_REF1(0) 140, which is the odd reference cell word line, is activated to select reference cell 142 from segment S0 of the second memory array 108. The data from the data cell 138 is compared to the reference signal from the reference cell 142 to provide the output data. The even and odd reference cell word lines improve tracking of memory cells in the even and odd memory cell word lines, respectively.

Figure 7:
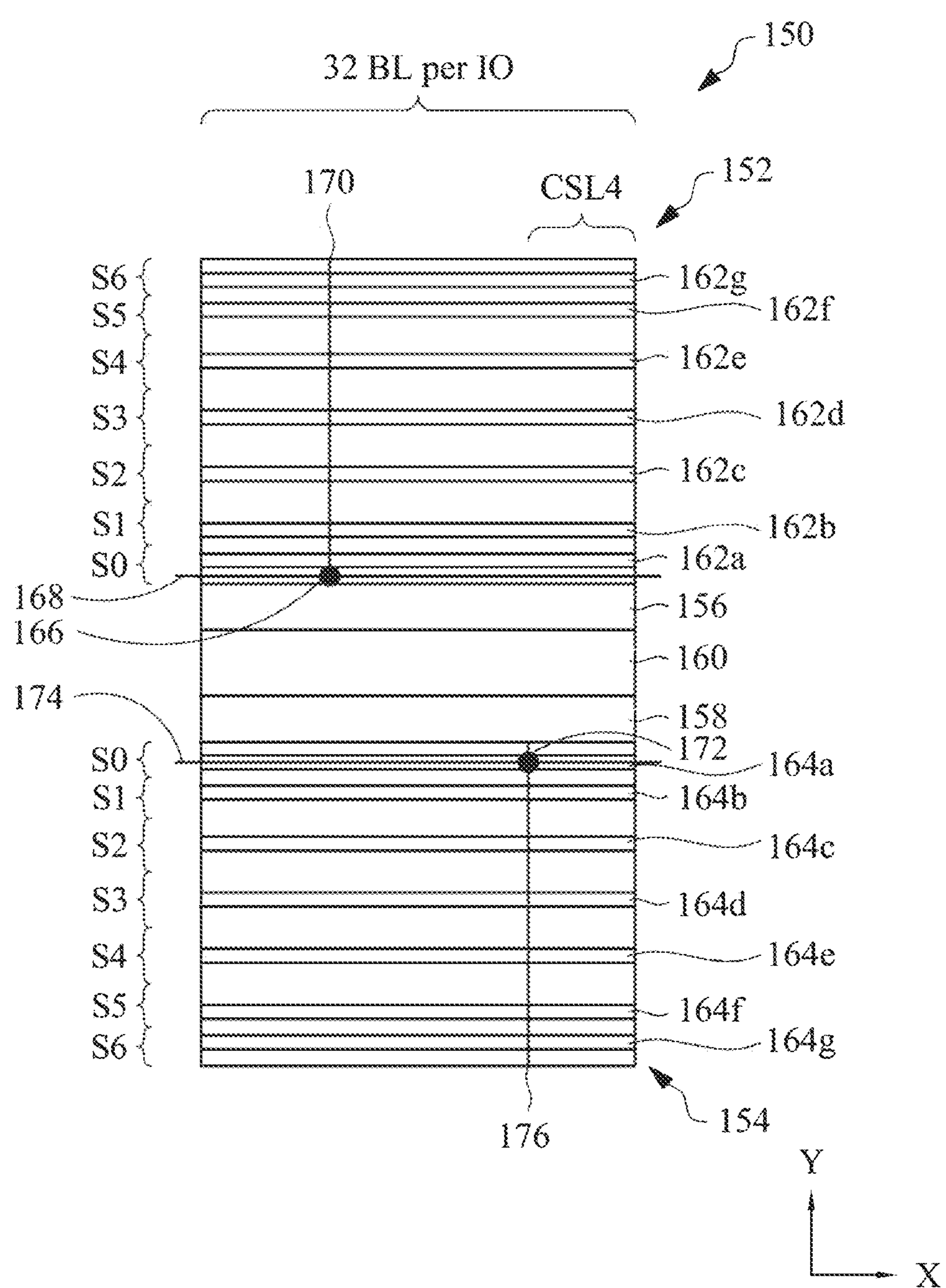
FIG. 7 is a diagram schematically illustrating a semiconductor memory device that includes a segmented reference structure that includes segments of word lines with 4 memory cell word lines per segment and segments of word lines with 16 memory cell word lines per segment, in accordance with some embodiments.

FIG. 7 is a diagram schematically illustrating a semiconductor memory device 150 that includes a segmented reference structure that includes segments of word lines S0, S1, S5, and S6 with 4 memory cell word lines per segment and segments of word lines S2-S4 with 16 memory cell word lines per segment, in accordance with some embodiments. Each of the segments of word lines S0-S6 includes at least one reference cell word line. The segments of word lines S0, S1, S5, and S6 with 4 memory cell word lines per segment are situated at edges of the memory cell arrays 152 and 154, where the memory cells situated along the edges of the memory cell arrays 152 and 154 have a higher bit line and source line resistance variation, i.e., a higher sigma. The segments of word lines S0, S1, S5, and S6 with 4 memory cell word lines near the edges of the memory cell arrays 152 and 154 better follow the higher sigma of the bit line and source line resistance variations, where denser reference cell word lines better track or follow column loading effects. The segments of word lines S2-S4 with 16 memory cell word lines per segment are situated between the segments of word lines S1 and S5.

The memory device 150 includes the first or upper memory array 152, the second or lower memory array 154, a first multiplexer 156, a second multiplexer 158, and sense amplifiers 160. The first multiplexer 156 is connected to the first memory array 152 and the sense amplifiers 160, and the second multiplexer 158 is connected to the second memory array 154 and the sense amplifiers 160.

The first memory array 152 includes first memory cells that store data and first reference cells that provide reference signals. The first memory cells are connected to first memory cell word lines in rows along the x-axis of the first memory array 152 and to first bit lines in columns along the y-axis of the first memory array 152. Each of the first memory cell word lines is connected to multiple first memory cells for storing data in the first memory array 152 and providing data signals to the sense amplifiers 160 through the first multiplexer 156. The first reference cells are connected to first reference cell word lines in first reference cell word line rows 162*a*-162*g* along the x-axis of the first memory array 152 and to first bit lines that are in columns along the y-axis of the first memory array 152. Each of the first reference cell word lines is connected to multiple reference cells for providing reference signals to the sense amplifiers 160 through the first multiplexer 156. In some embodiments, the first memory array 152 includes 32 bit lines per IO.

The second memory array 154 includes second memory cells that store data and second reference cells that provide reference signals. The second memory cells are connected to second memory cell word lines that are in rows along the x-axis of the second memory array 154 and to second bit lines that are in columns along the y-axis of the second memory array 154. Each of the second memory cell word lines is connected to multiple second memory cells for storing data in the second memory array 154 and providing data signals to the sense amplifiers 160 through the second multiplexer 158. Also, the second reference cells are connected to second reference cell word lines in second reference cell word line rows 164*a*-164*g* along the x-axis of the second memory array 154 and to second bit lines that are in columns along the y-axis of the second memory array 154. Each of the second reference cell word lines is connected to multiple reference cells for providing reference signals to the sense amplifiers 160 through the second multiplexer 158. In some embodiments, the second memory array 154 includes 32 bit lines per IO.

Each of the first memory array 152 and the second memory array 154 includes segments of word lines S0-S6, where each of the segments of word lines S0-S6 includes multiple memory cell word lines and at least one reference cell word line. The segments of word lines S0, S1, S5, and S6 include 4 memory cell word lines per segment and at least one reference cell word line, and the segments of word lines S2-S4 include 16 memory cell word lines per segment and at least one reference cell word line. The size of a segment of word lines S0-S6 is determined, at least in part, by column loading effects, such as bit line and source line resistance variations.

In operation, one of the memory cells in one of the segments of word lines S0-S6 in one of the memory arrays 152 and 154 is selected by selecting a memory cell word line and a memory cell bit line. Data from the selected memory cell is provided to the first multiplexer 156 or the second multiplexer 158 and forwarded to a first input of one of the sense amplifiers 160. Also, one of the reference cells in the one of the segments of word lines S0-S6 in the other one of the memory arrays 152 and 154 is selected by selecting the reference cell word line and a reference cell bit line. A reference signal from the reference cell is provided to the other one of the first multiplexer 156 or the second multiplexer 158 and forwarded to a second input of the one of the sense amplifiers 160. The sense amplifier compares the data at the first input to the reference signal at the second input and provides an output data signal.

For example, one of the memory cells 166 in the segment of word lines S0 in the first memory array 152 is selected by selecting memory cell word line 168 and memory cell bit line 170. Data from the selected memory cell 166 is provided to the first multiplexer 156 and forwarded to a first input of one of the sense amplifiers 160. Also, one of the reference cells 172 in the segment of word lines S0 in the second memory array 154 is selected by selecting the reference cell word line 174 and a reference cell bit line 176. A reference signal from the selected reference cell 172 is provided to the second multiplexer 158 and forwarded to a second input of the one of the sense amplifiers 160, which compares the data at the first input to the reference signal at the second input and provides an output data signal.

If a memory cell is selected from one of the segments of word lines S0-S6 in the first memory array 152, then a reference cell is selected from the same, corresponding segment of word lines S0-S6 in the second memory array 154, and if a memory cell is selected from one of the segments of word lines S0-S6 in the second memory array 154, then a reference cell is selected from the same, corresponding segment of word lines S0-S6 in the first memory array 152.

Figure 8:
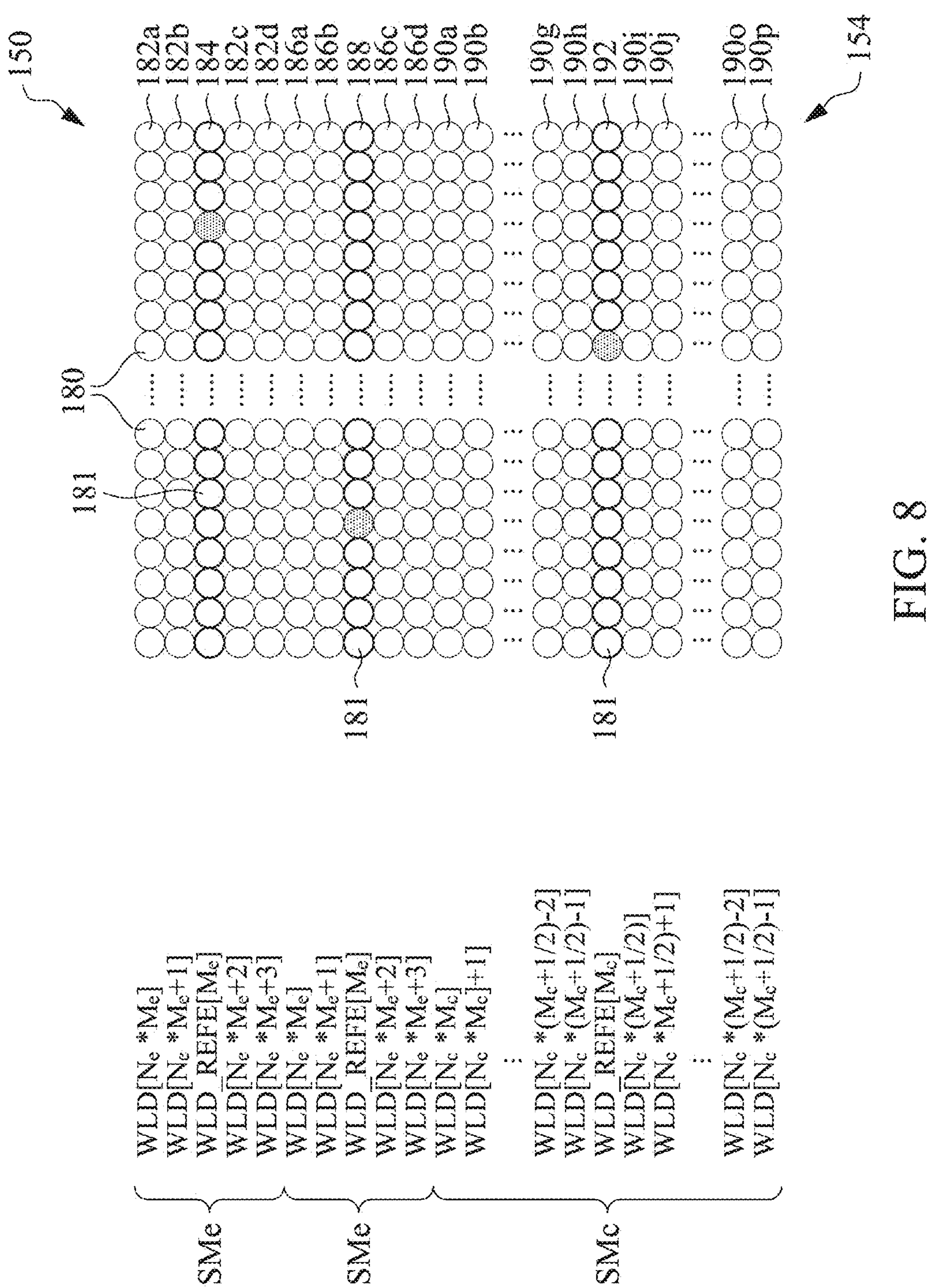
FIG. 8 is a diagram schematically illustrating memory cell word lines and reference cell word lines in the different segments of word lines in the second memory array in the memory device of FIG. 7, in accordance with some embodiments.

FIG. 8 is a diagram schematically illustrating second memory cells 180 in segments of word lines SMe and SMc in the second memory array 154 of the memory device 150, in accordance with some embodiments. Also, the segments of word lines SMe and SMc in the second memory array 154 includes reference cell word lines WLD_REFE(Me) and WLD_REF(Mc) that include second reference cells 181. In some embodiments, the first memory array 152 is like the second memory array 154.

The second memory array 154 includes segments of word lines SMe that each include Ne memory cell word lines and 1 reference cell word line, and segments of word lines SMc that each include Nc memory cell word lines and 1 reference cell word line. In some embodiments, the second memory array 154 includes segments of word lines SMe from 0 to 7 and from 120 to 127, where Ne equals 4 memory cell word lines per segment, and segments of word lines SMc from 2 to 29, where Nc equals 16 memory cell word lines per segment. This provides 512 memory cell word lines in the second memory array 154. In some embodiments, the first memory array 152 includes 512 memory cell word lines like the second memory array 154.

The segment of word lines SMe, where Me equals 0, i.e., segment S0, includes 4 memory cell word lines 182*a*-182*d* and 1 reference cell word line 184, and the segment of word lines SMe, where Me equals 1, i.e., segment S1, includes 4 memory cell word lines 186*a*-186*d* and 1 reference cell word line 188. The segment of word lines SMc, where Mc equals 3, i.e., segment S3, includes 16 memory cell word lines 190*a*-190*p* and 1 reference cell word line 192. The reference cell word line 184 is situated in the middle of the memory cell word lines 182*a*-182*d*, between memory cell word line 182*b* and memory cell word line 182*c*. The reference cell word line 188 is situated in the middle of the memory cell word lines 186*a*-186*d*, between memory cell word line 186*b* and memory cell word line 186*c*. The reference cell word line 192 is situated in the middle of the memory cell word lines 190*a*-190*p*, between memory cell word line 190*h* and memory cell word line 190*i*. The memory device 150 operates as described above in relation to FIG. 7.

Figure 9:
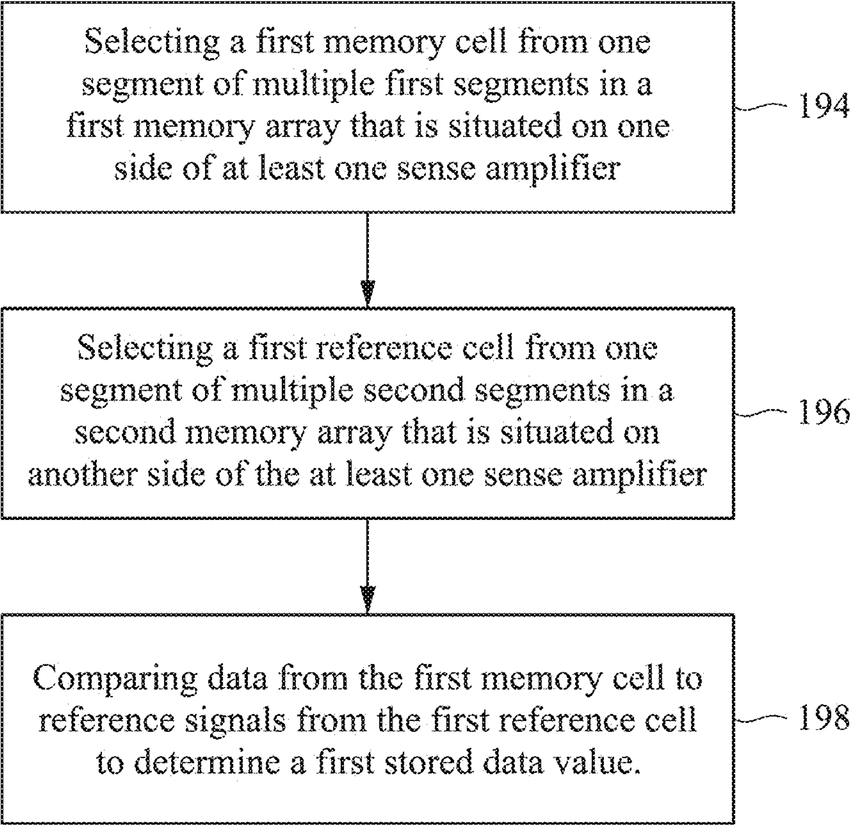
FIG. 9 is a diagram schematically illustrating a method of operating a semiconductor device, in accordance with some embodiments.

FIG. 9 is a diagram schematically illustrating a method of operating a semiconductor device, in accordance with some embodiments.

At step 194, the method includes selecting a first memory cell from one segment of multiple first segments in a first memory array that is situated on one side of at least one sense amplifier.

At step 196, the method includes selecting a first reference cell from one segment of multiple second segments in a second memory array that is situated on another side of the at least one sense amplifier. In some embodiments, selecting the first reference cell includes selecting a first reference word line from the middle of the one segment of the multiple second segments. In some embodiments, selecting the first reference cell includes selecting from the one segment of the multiple second segments one of multiple first reference word lines for sensing data from an even word line or selecting from the one segment of the multiple second segments another one of the multiple first reference word lines for sensing data from an odd word line.

At step 198, the method includes comparing data from the first memory cell to reference signals from the first reference cell to determine a first stored data value. In some embodiments, the method further includes selecting a second memory cell from the one segment of the multiple second segments in the second memory array, selecting a second reference cell from the one segment of the multiple first segments in the first memory array, and comparing data from the second memory cell to reference signals from the second reference cell to determine a second stored data value.

Figure 10:
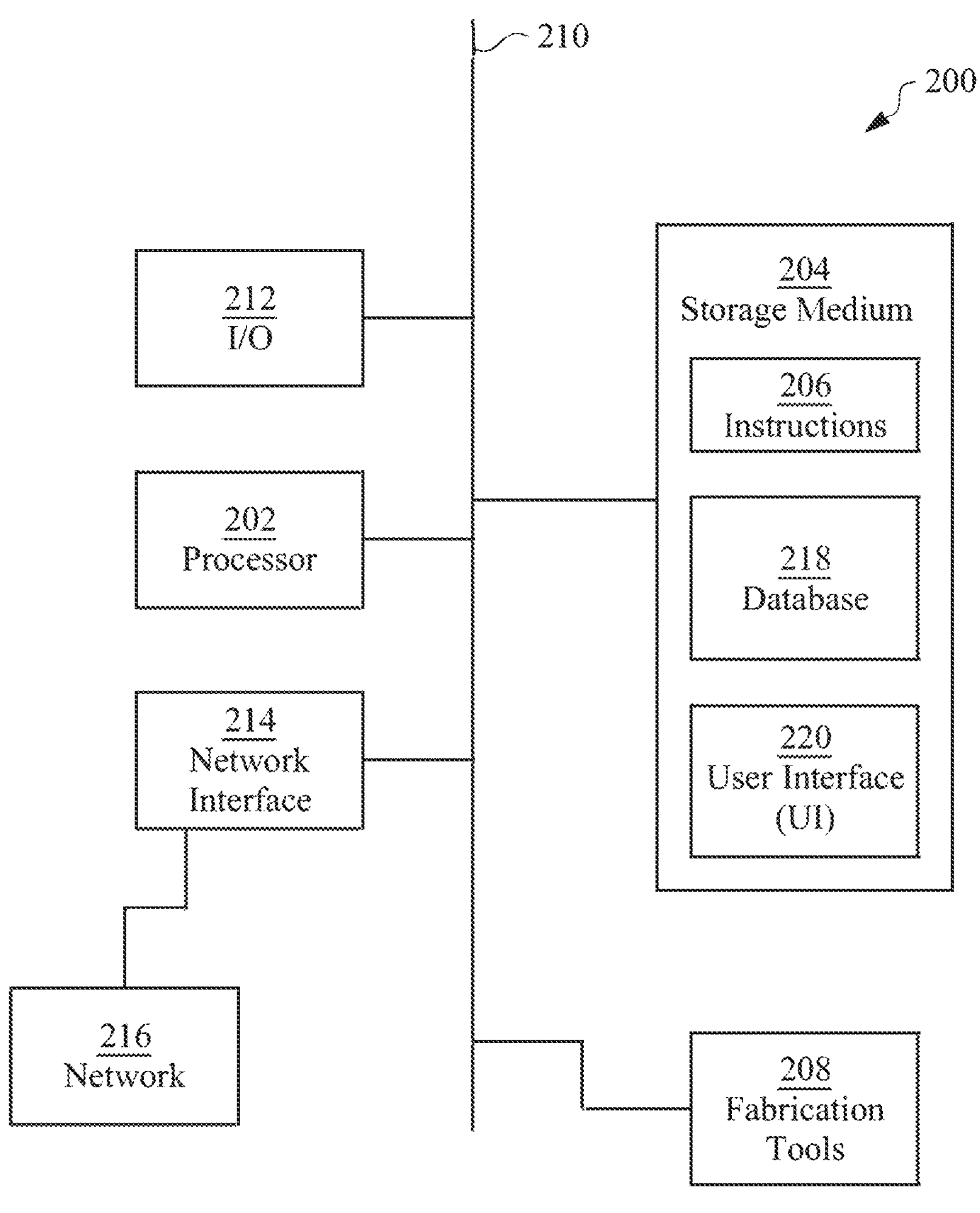
FIG. 10 is a block diagram schematically illustrating an example of a computer system configured to provide the semiconductor devices and methods of the current disclosure, in accordance with some embodiments.

FIG. 10 is a block diagram schematically illustrating an example of a computer system 200 configured to provide the semiconductor devices and methods of the current disclosure, in accordance with some embodiments. Some or all the design, layout, and manufacture of the semiconductor devices, also referred to as semiconductor circuits, can be performed by or with the computer system 200. In some embodiments, the computer system 200 includes an electronic design automation (EDA) system. In some embodiments, the semiconductor devices are ICs.

In some embodiments, the system 200 is a general-purpose computing device including a processor 202 and a non-transitory, computer-readable storage medium 204. The computer-readable storage medium 204 may be encoded with, e.g., store, computer program code such as executable instructions 206. Execution of the instructions 206 by the processor 202 provides (at least in part) a design tool that implements a portion or all the functions of the system 200, such as pre-layout simulations, post-layout simulations, routing, rerouting, and final layout for manufacturing. Further, fabrication tools 208 are included to further layout and physically implement the design and manufacture of the semiconductor devices. In some embodiments, execution of the instructions 206 by the processor 202 provides (at least in part) a design tool that implements a portion or all the functions of the system 200. In some embodiments, the system 200 includes a commercial router. In some embodiments, the system 200 includes an automatic place and route (APR) system.

The processor 202 is electrically coupled to the computer-readable storage medium 204 by a bus 210 and to an I/O interface 212 by the bus 210. A network interface 214 is also electrically connected to the processor 202 by the bus 210. The network interface 214 is connected to a network 216, so that the processor 202 and the computer-readable storage medium 204 can connect to external elements using the network 216. The processor 202 is configured to execute the computer program code or instructions 206 encoded in the computer-readable storage medium 204 to cause the system 200 to perform a portion or all the functions of the system 200, such as providing the semiconductor devices and methods of the current disclosure and other functions of the system 200. In some embodiments, the processor 202 is a central processing unit (CPU), a multi-processor, a distributed processing system, an application specific integrated circuit (ASIC), and/or a suitable processing unit.

In some embodiments, the computer-readable storage medium 204 is an electronic, magnetic, optical, electromagnetic, infrared, and/or semiconductor system or apparatus or device. For example, the computer-readable storage medium 204 can include a semiconductor or solid-state memory, a magnetic tape, a removable computer diskette, a random-access memory (RAM), a read-only memory (ROM), a rigid magnetic disk, and/or an optical disk. In some embodiments using optical disks, the computer-readable storage medium 204 can include a compact disk read only memory (CD-ROM), a compact disk read/write memory (CD-R/W), and/or a digital video disc (DVD).

In some embodiments, the computer-readable storage medium 204 stores computer program code or instructions 206 configured to cause the system 200 to perform a portion or all the functions of the system 200. In some embodiments, the computer-readable storage medium 204 also stores information which facilitates performing a portion or all the functions of the system 200. In some embodiments, the computer-readable storage medium 204 stores a database 218 that includes one or more of component libraries, digital circuit cell libraries, and databases.

The system 200 includes the I/O interface 212, which is coupled to external circuitry. In some embodiments, the I/O interface 212 includes a keyboard, keypad, mouse, trackball, trackpad, touchscreen, and/or cursor direction keys for communicating information and commands to the processor 202.

The network interface 214 is coupled to the processor 202 and allows the system 200 to communicate with the network 216, to which one or more other computer systems are connected. The network interface 214 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 200 can be performed in two or more systems that are like system 200.

The system 200 is configured to receive information through the I/O interface 212. The information received through the I/O interface 212 includes one or more of instructions, data, design rules, libraries of components and cells, and/or other parameters for processing by the processor 202. The information is transferred to the processor 202 by the bus 210. Also, the system 200 is configured to receive information related to a user interface (UI) through the I/O interface 212. This UI information can be stored in the computer-readable storage medium 204 as a UI 220.

In some embodiments, a portion or all the functions of the system 200 are implemented via a standalone software application for execution by a processor. In some embodiments, a portion or all the functions of the system 200 are implemented in a software application that is a part of an additional software application. In some embodiments, a portion or all the functions of the system 200 are implemented as a plug-in to a software application. In some embodiments, at least one of the functions of the system 200 is implemented as a software application that is a portion of an EDA tool. In some embodiments, a portion or all the functions of the system 200 are implemented as a software application that is used by the system 200. In some embodiments, a layout diagram is generated using a tool such as VIRTUOSO available from CADENCE DESIGN SYSTEMS, Inc., or another suitable layout generating tool.

In some embodiments, the routing, layouts, and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a digital video disc or a digital versatile disc (DVD), a magnetic disk such as a hard disk, a semiconductor memory such as a ROM and a RAM, and a memory card, and the like.

As noted above, embodiments of the system 200 include fabrication tools 208 for implementing the manufacturing processes of the system 200. For example, based on the final layout, photolithographic masks may be generated, which are used to fabricate the semiconductor device by the fabrication tools 208.

Figure 11:
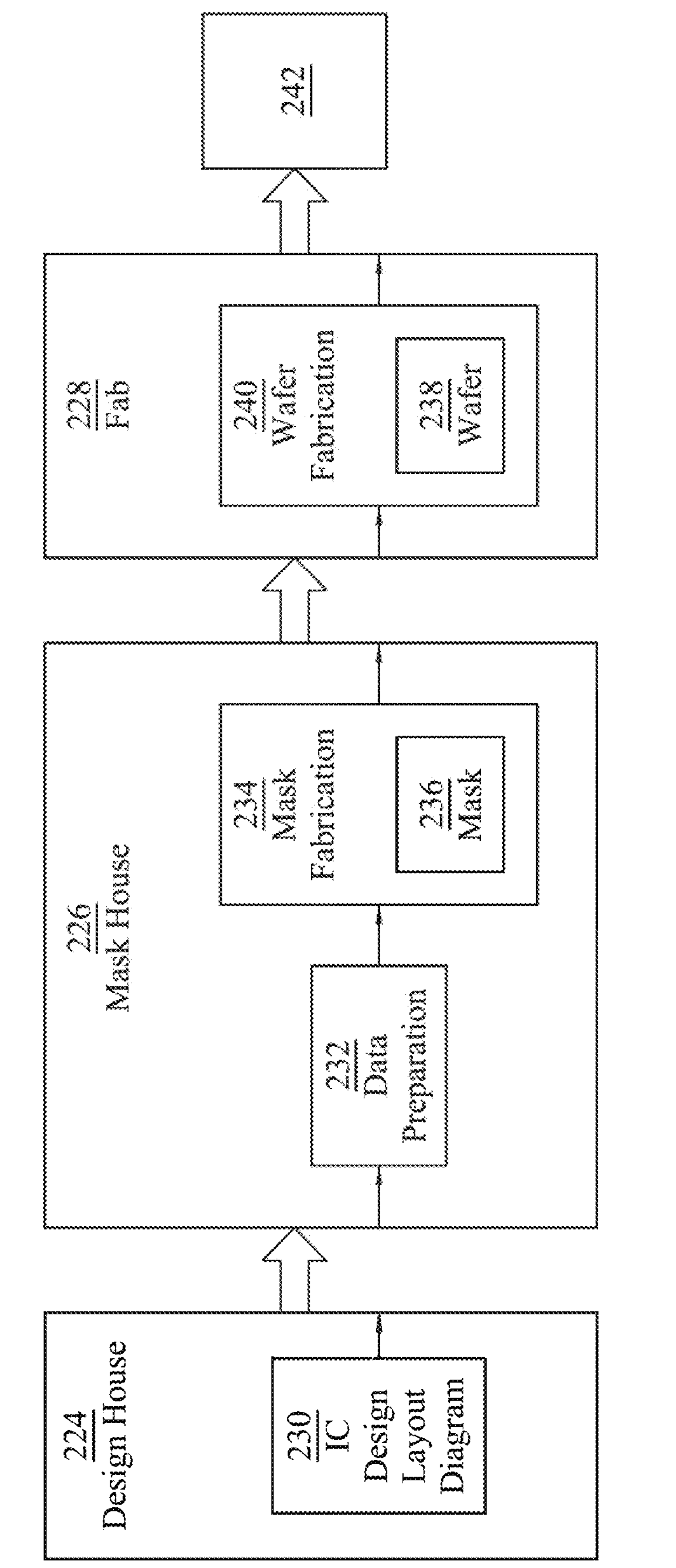
FIG. 11 is a block diagram of a semiconductor device manufacturing system and a semiconductor device manufacturing flow associated therewith, in accordance with some embodiments.

Further aspects of device fabrication are disclosed in conjunction with FIG. 11, which is a block diagram of a semiconductor device manufacturing system 222 and a semiconductor device manufacturing flow associated therewith, in accordance with some embodiments. In some embodiments, based on a layout diagram, one or more semiconductor masks and/or at least one component in a layer of a semiconductor device is fabricated using the manufacturing system 222.

In FIG. 11, the semiconductor device manufacturing system 222 includes entities, such as a design house 224, a mask house 226, and a semiconductor device manufacturer/fabricator ("Fab") 228, that interact with one another in the design, development, and manufacturing cycles and/or services related to manufacturing a semiconductor device, such as the semiconductor devices described herein. The entities in the system 222 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 224, the mask house 226, and the semiconductor device fab 228 are owned by a single larger company. In some embodiments, two or more of the design house 224, the mask house 226, and the semiconductor device fab 228 coexist in a common facility and use common resources.

The design house (or design team) 224 generates a semiconductor device design layout diagram 230. The semiconductor device design layout diagram 230 includes various geometrical patterns, or semiconductor device layout diagrams designed for a semiconductor device. The geometrical patterns correspond to patterns of metal, oxide, or semiconductor layers that make up the various components of the semiconductor structures to be fabricated. The various layers combine to form various semiconductor device features. For example, a portion of the semiconductor device design layout diagram 230 includes various semiconductor device features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 224 implements a design procedure to form a semiconductor device design layout diagram 230. The semiconductor device design layout diagram 230 is presented in one or more data files having information of the geometrical patterns. For example, semiconductor device design layout diagram 230 can be expressed in a GDSII file format or DFII file format. In some embodiments, the design procedure includes one or more of analog circuit design, digital circuit design, logic circuit design, standard cell circuit design, power distribution network (PDN) design including power via design, supply voltage track design, reference voltage track design, place and route routines, and physical layout designs.

The mask house 226 includes data preparation 232 and mask fabrication 234. The mask house 226 uses the semiconductor device design layout diagram 230 to manufacture one or more masks 236 to be used for fabricating the various layers of the semiconductor device or semiconductor structure. The mask house 226 performs mask data preparation 232, where the semiconductor device design layout diagram 230 is translated into a representative data file (RDF). The mask data preparation 232 provides the RDF to the mask fabrication 234. The mask fabrication 234 includes a mask writer that converts the RDF to an image on a substrate, such as a mask (reticle) 236 or a semiconductor wafer 238. The design layout diagram 230 is manipulated by the mask data preparation 232 to comply with characteristics of the mask writer and/or criteria of the semiconductor device fab 228. In FIG. 11, the mask data preparation 232 and the mask fabrication 234 are illustrated as separate elements. In some embodiments, the mask data preparation 232 and the mask fabrication 234 can be collectively referred to as mask data preparation.

In some embodiments, the mask data preparation 232 includes an optical proximity correction (OPC) which uses lithography enhancement techniques to compensate for image errors, such as those that can arise from diffraction, interference, other process effects and the like. The OPC adjusts the semiconductor device design layout diagram 230. In some embodiments, the mask data preparation 232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 232 includes a mask rule checker (MRC) that checks the semiconductor device design layout diagram 230 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the semiconductor device design layout diagram 230 to compensate for limitations during the mask fabrication 234, which may undo part of the modifications performed by OPC to meet mask creation rules.

In some embodiments, the mask data preparation 232 includes lithography process checking (LPC) that simulates processing that will be implemented by the semiconductor device fab 228. LPC simulates this processing based on the semiconductor device design layout diagram 230 to create a simulated manufactured device. The processing parameters in LPC simulation can include parameters associated with various processes of the semiconductor device manufacturing cycle, parameters associated with tools used for manufacturing the semiconductor device, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are to be repeated to further refine the semiconductor device design layout diagram 230.

The above description of mask data preparation 232 has been simplified for the purposes of clarity. In some embodiments, data preparation 232 includes additional features such as a logic operation (LOP) to modify the semiconductor device design layout diagram 230 according to manufacturing rules. Additionally, the processes applied to the semiconductor device design layout diagram 230 during data preparation 232 may be executed in a variety of different orders.

After the mask data preparation 232 and during the mask fabrication 234, a mask 236 or a group of masks 236 are fabricated based on the modified semiconductor device design layout diagram 230. In some embodiments, the mask fabrication 234 includes performing one or more lithographic exposures based on the semiconductor device design layout diagram 230. In some embodiments, an electron-beam (e-beam) or a mechanism of multiple e-beams is used to form a pattern on a mask (photomask or reticle) 236 based on the modified semiconductor device design layout diagram 230. The mask 236 can be formed in various technologies. In some embodiments, the mask 236 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 236 includes a transparent substrate (e.g., fused quartz) and an opaque material (e.g., chromium) coated in the opaque regions of the binary mask. In another example, the mask 236 is formed using a phase shift technology. In a phase shift mask (PSM) version of the mask 236, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 234 is used in a variety of processes. For example, such a mask(s) is used in an ion implantation process to form various doped regions in the semiconductor wafer 238, in an etching process to form various etching regions in the semiconductor wafer 238, and/or in other suitable processes.

The semiconductor device fab 228 includes wafer fabrication 240. The semiconductor device fab 228 is a semiconductor device fabrication business that includes one or more manufacturing facilities for the fabrication of a variety of different semiconductor device products. In some embodiments, the semiconductor device fab 228 is a semiconductor foundry. For example, there may be a manufacturing facility for the front end of line (FEOL) fabrication of a plurality of semiconductor device products, while a second manufacturing facility may provide the BEOL fabrication for the interconnection and packaging of the semiconductor device products, and a third manufacturing facility may provide other services for the foundry business.

The semiconductor device fab 228 uses the mask(s) 236 fabricated by the mask house 226 to fabricate the semiconductor structures or semiconductor devices 242 of the current disclosure. Thus, the semiconductor device fab 228 at least indirectly uses the semiconductor device design layout diagram 230 to fabricate the semiconductor structures or semiconductor devices 242 of the current disclosure. Also, the semiconductor wafer 238 includes a silicon substrate or other proper substrate having material layers formed thereon, and the semiconductor wafer 238 further includes one or more of various doped regions, dielectric features, multilevel interconnects, and the like (formed at subsequent manufacturing steps). In some embodiments, the semiconductor wafer 238 is fabricated by the semiconductor device fab 228 using the mask(s) 236 to form the semiconductor structures or semiconductor devices 242 of the current disclosure. In some embodiments, the semiconductor device fabrication includes performing one or more lithographic exposures based at least indirectly on the semiconductor device design layout diagram 230.

Disclosed embodiments provide a semiconductor memory device that includes a segmented reference structure. The memory device includes a first memory array that includes segments of word lines that each include memory cell word lines and at least one reference cell word line, and a second memory array that includes segments of word lines that each include memory cell word lines and at least one reference cell word line. In the segmented reference structure, one or more reference cell sets from one of the first and second memory arrays is shared by a segment of word lines in the other one of the first and second memory arrays. The reference cell set provides reference values that are compared to data from the memory cells in the segment of word lines. The segmented reference structure more closely tracks or follows the memory cells connected to the memory cell word lines. In some embodiments, the size of a segment of word lines, i.e., the number of word lines in a segment, is determined based, at least in part, on column loading effects, such as bit line and source line resistance variations. In some embodiments, the memory cells situated along edges of a memory cell array have a higher bit line and source line resistance variation, i.e., a higher sigma, such that the size of the segment of word lines near the edge is reduced to better follow the higher sigma of the bit line and source line resistance variations. The denser reference word lines in the smaller segments of word lines better track or follow column loading effects.

In some embodiments, a semiconductor device includes a first memory array that includes first segments of first memory cells situated on a first side of at least one sense amplifier and a second memory array that includes second segments of second memory cells situated on a second side of the at least one sense amplifier. First reference cells connected to first reference word lines in the first memory array are configured to provide first reference signals for sensing data from the second memory cells in the second memory array, and second reference cells connected to second reference word lines in the second memory array are configured to provide second reference signals for sensing data from the first memory cells in the first memory array.

Disclosed embodiments further provide a method of operating a semiconductor device that has a segmented reference structure. The method includes selecting a first memory cell from one segment of first segments in a first memory array and selecting a first reference cell from one segment of second segments in a second memory array. The method further includes comparing data from the first memory cell to reference signals from the first reference cell to determine a first stored data value.

The segmented reference structure improves read margins of the memory device. In addition, a memory device with a segmented reference structure includes less reference trim code than a memory device with local references, such that device area is reduced.

In accordance with some embodiments, a semiconductor device including at least one sense amplifier, a first memory array that includes first segments of first memory cells situated on a first side of the at least one sense amplifier, a second memory array that includes second segments of second memory cells situated on a second side of the at least one sense amplifier that is different than the first side of the at least one sense amplifier, first reference cells connected to first reference word lines in the first memory array and configured to provide first reference signals for sensing data from the second memory cells in the second memory array, and second reference cells connected to second reference word lines in the second memory array and configured to provide second reference signals for sensing data from the first memory cells in the first memory array. The first reference cells connected to one of the first reference word lines are configured to provide the first reference signals for sensing data from one of the second segments and the first reference cells connected to another one of the first reference word lines are configured to provide the first reference signals for sensing data from another one of the second segments.

In accordance with further embodiments, a semiconductor device, including at least one sense amplifier, a first memory array that includes first segments of first memory cells situated on a first side of the at least one sense amplifier, a second memory array that includes second segments of second memory cells situated on a second side of the at least one sense amplifier, first reference word lines connected to first reference cells in the first memory array for sensing data from the second memory cells in the second memory array, and second reference word lines connected to second reference cells in the second memory array for sensing data from the first memory cells in the first memory array. The at least one of the second segments includes sixteen to sixty-four word lines and each of the first reference word lines is configured for sensing data from a different one of the second segments and at least one of the first segments includes sixteen to sixty-four word lines and each of the second reference word lines is configured for sensing data from a different one of the first segments.

In accordance with still further disclosed aspects, a method of operating a semiconductor device. The method including selecting a first memory cell from one segment of multiple first segments in a first memory array that is situated on one side of at least one sense amplifier, selecting a first reference cell from one segment of multiple second segments in a second memory array that is situated on another side of the at least one sense amplifier, and comparing data from the first memory cell to reference signals from the first reference cell to determine a first stored data value.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

at least one sense amplifier;

a first memory array that includes first segments of first memory cells situated on a first side of the at least one sense amplifier;

a second memory array that includes second segments of second memory cells situated on a second side of the at least one sense amplifier that is different than the first side of the at least one sense amplifier;

first reference cells connected to first reference word lines in the first memory array and configured to provide first reference signals for sensing data from the second memory cells in the second memory array; and second reference cells connected to second reference word lines in the second memory array and configured to provide second reference signals for sensing data from the first memory cells in the first memory array, wherein the first reference cells connected to one of the first reference word lines are configured to provide the first reference signals for sensing data from one of the second segments and the first reference cells connected to another one of the first reference word lines are configured to provide the first reference signals for sensing data from another one of the second segments, and wherein the second reference cells connected to one of the second reference word lines are configured to provide the second reference signals for sensing data from one of the first segments and the second reference cells connected to another one of the second reference word lines are configured to provide the second reference signals for sensing data from another one of the first segments.

2. The device of claim 1, wherein at least one of the first segments has a segment word line size of sixteen to sixty-four word lines.

3. The device of claim 1, wherein at least one of the first segments that is close to an edge of the first memory array has a segment word line size of four to eight word lines.

4. The device of claim 1, wherein an area overhead for reference word lines and trim code is one to five percent of the device.

5. The device of claim 1, wherein each of the first reference word lines is in the middle of a corresponding one of the first segments.

6. The device of claim 1, wherein each first segment of the first segments includes multiple first reference word lines.

7. The device of claim 6, wherein one of the multiple first reference word lines is for sensing data from an even word line and another one of the multiple first reference word lines is for sensing data from an odd word line.

8. The device of claim 6, wherein the multiple first reference word lines are situated in the middle of the first segment.

9. The device of claim 6, wherein an even first reference word line is situated on one edge of the first segment and an odd first reference word line is situated on an opposite edge of the first segment.

10. The device of claim 1, wherein a first word line size of the first segments is based on column loading effects including bit line/source line resistance variations of the first memory cells.

11. The method of claim 10, wherein denser second reference word lines improve tracking of the bit line/source line resistance variations of the first memory cells.

12. A semiconductor device, comprising:

at least one sense amplifier;

a first memory array that includes first segments of first memory cells situated on a first side of the at least one sense amplifier;

a second memory array that includes second segments of second memory cells situated on a second side of the at least one sense amplifier;

first reference word lines connected to first reference cells in the first memory array for sensing data from the second memory cells in the second memory array; and second reference word lines connected to second reference cells in the second memory array for sensing data from the first memory cells in the first memory array, wherein at least one of the second segments includes sixteen to sixty-four word lines and each of the first reference word lines is configured for sensing data from a different one of the second segments and at least one of the first segments includes sixteen to sixty-four word lines and each of the second reference word lines is configured for sensing data from a different one of the first segments.

13. The device of claim 12, wherein a first word line size of the first segments is based on column loading effects including bit line/source line resistance variations of the first memory cells and denser second reference word lines improve tracking of the bit line/source line resistance variations of the first memory cells.

14. The device of claim 12, wherein at least one of the first segments that is close to an edge of the first memory array has a segment word line size of four to eight word lines.

15. The device of claim 12, wherein each of the first reference word lines is in the middle of a corresponding one of the first segments.

16. The device of claim 12, wherein each first segment of the first segments includes multiple first reference word lines and one of the multiple first reference word lines is for sensing data from an even word line and another one of the multiple first reference word lines is for sensing data from an odd word line.

17. The device of claim 12, wherein each first segment of the first segments includes multiple first reference word lines situated in the middle of the first segment.

18. A method of operating a semiconductor device, the method comprising:

selecting a first memory cell from one segment of multiple first segments in a first memory array that is situated on one side of at least one sense amplifier;

selecting a first reference cell from one segment of multiple second segments in a second memory array that is situated on another side of the at least one sense amplifier;

comparing data from the first memory cell to reference signals from the first reference cell to determine a first stored data value;

selecting a second memory cell from the one segment of the multiple second segments in the second memory array;

selecting a second reference cell from the one segment of the multiple first segments in the first memory array; and comparing data from the second memory cell to reference signals from the second reference cell to determine a second stored data value.

19. The method of claim 18, wherein selecting the first reference cell includes selecting a first reference word line from the middle of the one segment of the multiple second segments.

20. The method of claim 18, wherein selecting the first reference cell includes selecting from the one segment of the multiple second segments one of multiple first reference word lines for sensing data from an even word line or selecting from the one segment of the multiple second segments another one of the multiple first reference word lines for sensing data from an odd word line.

* * * * *